(12) United States Patent
Kim et al.

(10) Patent No.: US 11,348,358 B2
(45) Date of Patent: May 31, 2022

(54) ELECTRONIC DEVICE INCLUDING STRUCTURE COMPENSATING FOR HEIGHT DIFFERENCE BETWEEN SENSOR AND ELASTIC MEMBER DISPOSED ON BACK SURFACE OF DISPLAY

(71) Applicant: Samsung Electronics Co., Ltd., Gyeonggi-do (KR)

(72) Inventors: Joohan Kim, Gyeonggi-do (KR); Bongjae Rhee, Gyeonggi-do (KR); Yongwon Lee, Gyeonggi-do (KR); Seungho Hwang, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/266,156

(22) PCT Filed: Jun. 24, 2019

(86) PCT No.: PCT/KR2019/007576
§ 371 (c)(1),
(2) Date: Feb. 5, 2021

(87) PCT Pub. No.: WO2020/032386
PCT Pub. Date: Feb. 13, 2020

(65) Prior Publication Data
US 2021/0312154 A1 Oct. 7, 2021

(30) Foreign Application Priority Data
Aug. 6, 2018 (KR) .......... 10-2018-0091207

(51) Int. Cl.
*G06V 40/13* (2022.01)
*G06F 1/18* (2006.01)

(52) U.S. Cl.
CPC .......... *G06V 40/1306* (2022.01); *G06F 1/181* (2013.01)

(58) Field of Classification Search
CPC ....... G06V 40/1306; G06F 1/181; G06F 1/16; H05K 3/32
See application file for complete search history.

(56) References Cited

U.S. PATENT DOCUMENTS

2006/0227523 A1 10/2006 Pennaz et al.
2014/0071637 A1 3/2014 Hsu et al.
(Continued)

FOREIGN PATENT DOCUMENTS

CN 106445212 A 2/2017
EP 3328039 A1 * 5/2018 .......... G06F 1/1643
(Continued)

*Primary Examiner* — Premal R Patel
(74) *Attorney, Agent, or Firm* — Cha & Reiter, LLC.

(57) ABSTRACT

An electronic device having a step compensated fingerprint sensor is disclosed. The electronic device includes a display panel including a front surface and a rear surface; an elastic member, disposed on the rear surface of the display panel, including an opening and having a first designated height; a sensor having a second designated height lower than the first designated height and disposed in an inner space formed by a side surface, having the first designated height, of the opening and the rear surface of the display panel; a connection member electrically connected to the sensor and disposed on the sensor with a third designated height compensating for a difference between the first designated height and the second designated height; and a flexible substrate electrically connected to the connection member in the opening and extended to an area of the elastic member.

15 Claims, 16 Drawing Sheets

(56) References Cited

U.S. PATENT DOCUMENTS

| | | | |
|---|---|---|---|
| 2015/0071509 A1* | 3/2015 | Myers | G06K 9/0002 382/124 |
| 2015/0234504 A1 | 8/2015 | Lee | |
| 2018/0101254 A1 | 4/2018 | Wu | |
| 2019/0163003 A1 | 5/2019 | Kim et al. | |

FOREIGN PATENT DOCUMENTS

| | | |
|---|---|---|
| JP | 2008-539473 A | 11/2008 |
| KR | 10-2015-0019628 A | 2/2015 |
| KR | 10-2015-0120113 A | 10/2015 |
| KR | 10-1661160 B1 | 9/2016 |
| KR | 10-2018-0013328 A | 2/2018 |

* cited by examiner

ELECTRONIC DEVICE INCLUDING STRUCTURE COMPENSATING FOR HEIGHT DIFFERENCE BETWEEN SENSOR AND ELASTIC MEMBER DISPOSED ON BACK SURFACE OF DISPLAY

CROSS REFERENCE TO RELATED APPLICATIONS

This application is a National Phase Entry of PCT International Application No. PCT/KR2019/007576, which was filed on Jun. 24, 2019, and claims a priority to Korean Patent Application No. 10-2018-0091207, which was filed on Aug. 6, 2018, the contents of which are incorporated herein by reference.

TECHNICAL FIELD

Various embodiments of the present invention relate to a sensor mounting structure of an electronic device.

BACKGROUND ART

The electronic device includes a display and an input button. The input button includes a biometric information sensor for recognizing a user's biometric information (e.g. fingerprint information) in a part of the input button. For example, the biometric information sensor includes a proximity sensor, an iris sensor, a fingerprint sensor, and a heart rate sensor, and is used to detect biometric information on a part of a user's body.

These sensors have a structure in which the sensing area to be sensed is exposed to the outside, and various methods such as an ultrasonic method, a cap method, and an optical method are used.

For example, when the fingerprint sensor is a front fingerprint sensor, the fingerprint sensor is disposed in the display.

DISCLOSURE OF INVENTION

Technical Problem

When the biometric information sensor is a sensor mounted in a display of an electronic device, the flexible substrate of the sensor (flexible printed circuit board; FPCB) is mounted on the mounting peripheral structure due to a difference in thickness between components of the front sensor mounting portion and the mounting peripheral portion.

As a result, a lift of the flexible substrate of the biometric information sensor and a modulus deviation of the biometric information sensor due to the attachment lift of the biometric information sensor occur, and these occurrence causes poor communication or performance degradation.

Therefore, it is necessary to provide various embodiments, in an electronic device in which a sensor is overlapped with a display when the sensor is mounted on a display panel, to provide an electronic device capable of securing stable sensor performance by avoiding damage caused by bending/cracks, lifting of the adhesive portion of the flexible substrate of the sensor and a sensor lifting phenomenon occurring due to a difference in thickness between the sensor and the mounting peripheral structure.

Solution to Problem

An electronic device according to various embodiments of the present disclosure includes a display panel including a front surface and a rear surface, an elastic member including an opening and having a first designated height and disposed on the rear surface of the display panel, and a sensor having a second designated height lower than the first designated height and disposed in an inner space formed by a side surface of the opening having the first designated height and the rear surface of the display panel, a connection member, electrically connected to the sensor, having a third designated height and disposed above the sensor for compensating for a difference between the first designated height and the second designated height and a flexible substrate electrically connected to the connection member in the opening, and disposed under the elastic member.

An electronic device according to various embodiments of the present disclosure includes a housing including a first plate facing a first direction and a second plate facing a second direction opposite to the first direction and a side member surrounding at least a portion of the space between the first plate and the second plate; a display panel including a front surface facing the first direction and a rear surface facing a second direction opposite to the first direction, and disposed in the second direction on at least a part of the first plate; at least one sheet layer disposed on the rear surface of the display panel in the second direction and having an opening formed in at least a portion; a fingerprint sensor disposed in contact with the rear surface of the display through the opening; a flexible substrate in which at least a portion overlaps with the fingerprint sensor and at least a portion of the other is disposed to overlap with the at least one sheet layer; and a step compensation member, disposed between the fingerprint sensor and the flexible substrate for electrically connecting the fingerprint sensor and the flexible substrate, for compensating for a step difference caused by a height difference between the sensor and the at least one sheet layer.

Advantageous Effects of Invention

The present invention provides a stable sensor by preventing a lift up of the biometric information sensor, a lift up of the adhesive portion of the biometric information sensor and damage due to bending/cracking by the step compensation mounting structure between the biometric information sensor and the sensor periphery according to various embodiments and achieves a stable performance.

BEST MODE FOR CARRYING OUT THE INVENTION

Figure 1:
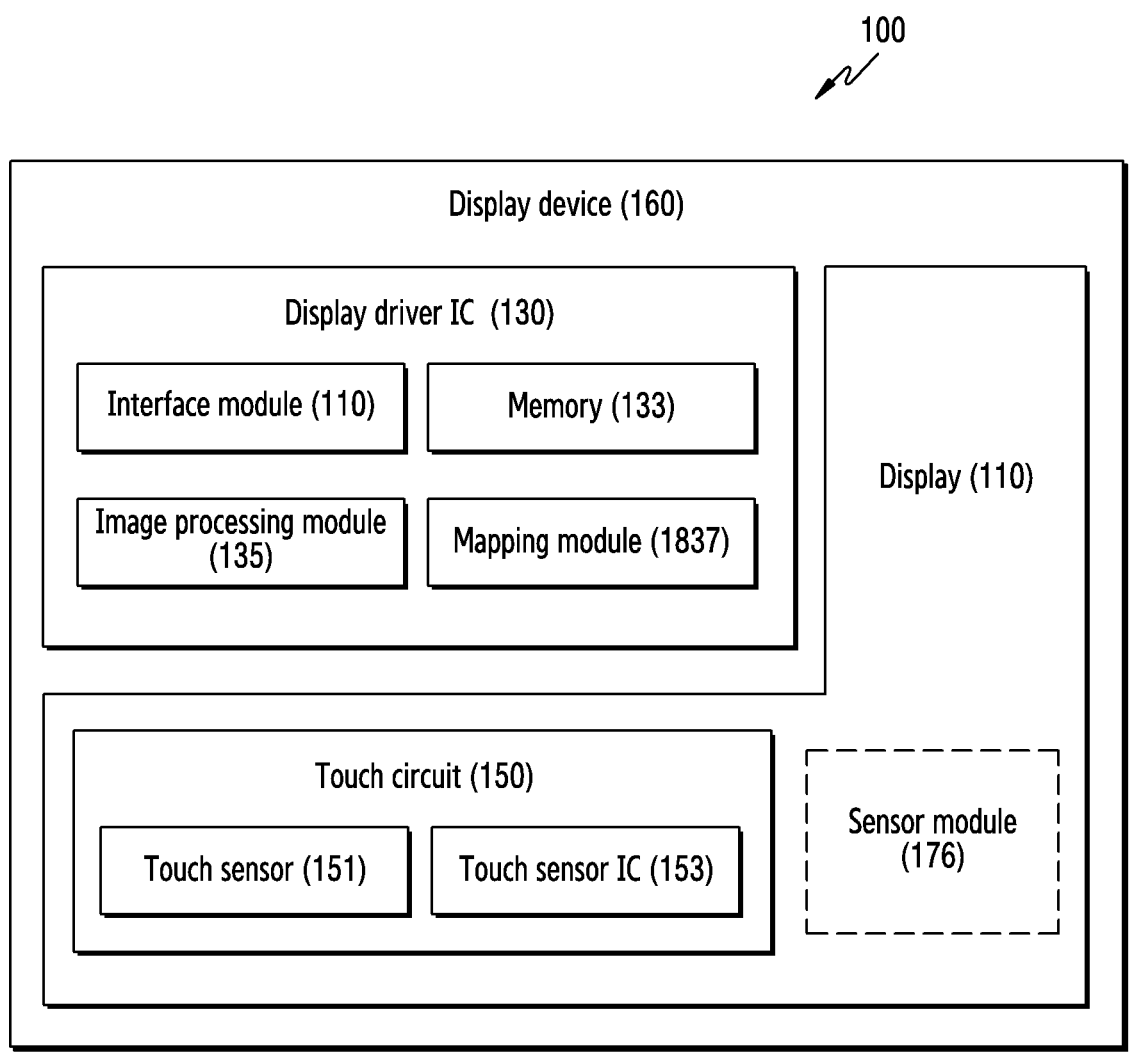
FIG. 1 is a block diagram of a display device according to various embodiments.

Hereinafter, various embodiments of the present disclosure will be described with reference to the accompanying drawings. But this is not intended to limit the present disclosure to a specific embodiment, and it is to be understood as including various modifications, equivalents, or alternative of the embodiments of the present disclosure. Similar reference numerals are used for similar elements in connection with the description of the drawings.

For example, an electronic device according to various embodiments of the present disclosure includes a smartphone, a tablet PC, a mobile phone, a video phone, an e-book reader, a desktop personal computer, a laptop personal computer, a netbook computer, a workstation, a server, a personal digital assistant (PDA), a portable multimedia player (PMP), and MP3 player, a mobile medical device, a camera or a wearable device (e.g. smart glasses, head-mounted-device (HMD), an electronic clothing, an electronic bracelet, an electronic necklace, an electronic appcessory, an electronic tattoo, a smart mirror or a smart watch.

In some embodiments, an electronic device is a smart home appliance. The smart home appliance includes a TV, a DVD (digital video disk) player, an audio, a refrigerator, an air conditioner, a vacuum cleaner, an oven, a microwave oven, a washing machine, an air purifier, a set-top box, a home automation control panel, a security control panel, a TV box (e.g. Samsung HomeSync™, Apple TV™ or Google TV™, a game console (e.g. Xbox™, PlayStation™), an electronic dictionary, an electronic key, a camcorder, or an electronic picture frame.

In another embodiment, an electronic device includes at least one of various medical devices (e.g. various portable medical measuring devices (a blood glucose meter, a heart rate meter, a blood pressure meter, or a body temperature meter, etc.), MRA (magnetic resonance angiography), MRI (magnetic resonance imaging), CT (computed tomography), camera, or ultrasound, etc.), a navigation device, a GPS receiver (global positioning system receiver), EDR (event data recorder), FDR (flight data recorder), a car infotainment devices, an electronic equipment for ships (ex: navigation equipment for ships, gyro compass, etc.), an aviation electronics (avionics), a security equipment, a vehicle head unit, an industrial or domestic robots, ATM (automatic teller's machine) in financial institutions, POS (point of sales) of the store or a device of internet of things device (e.g. light bulbs, various sensors, electric or gas meters, a sprinkler device, fire alarms, temperature controllers (thermostat), a street lamp, a toaster, an exercise equipment, a hot water tank, a heater, boiler, etc.)

According to some embodiment, an electronic device includes at least one of furniture or a part of building/structure, an electronic board, an electronic sign receiving device, a projector, or various measuring devices (e.g. water, electricity, gas, or radio wave measurement equipment, etc.). In various embodiments, the electronic device is a combination of one or more of the aforementioned various devices. An electronic device according to an embodiment is a flexible electronic device. In addition, an electronic device according to an embodiment of the present disclosure is not limited to the above devices, it may include new electronic devices according to technological advances.

FIG. 1 is a block diagram 100 of a display device 160 according to various exemplary embodiments.

Referencing to FIG. 1, the display device 160 includes a display 110 and a display driver IC (DDI) 130 for controlling it. DDI 130 includes an interface module 131, a memory 133 (e.g. buffer memory), an image processing module 135, or a mapping module 137. For example, DDI 130 receives an image data and an image information including an image control signal corresponding to a command for controlling the image data from other components of the electronic device through the interface module. For example, according to one embodiment, video information is received from a processor 120 (e.g. a main processor 121 such as an application processor) or a coprocessor 123 (e.g. graphic processing unit) that operates independently of the function of the main processor 121. DDI 130 communicates through a touch circuit (150) or a sensor module 176 through the interface module 131. In addition, for example, DDI 130 stores at least some of the received image information in the memory 133 in a frame unit. For example, the image processing module 135 performs pre-processing or post-processing (e.g. adjustment of resolution, brightness, or scale) of at least some of the image data mentioned above based on the characteristics of the image data or the characteristics of the display 110. The mapping module 137 generates a voltage value or a current value corresponding to the image data pre-processed or post-processed through the image processing module 135. According to one embodiment, for example, generation of the voltage values or the current values is performed at least based on a property of pixels of the display 110 (e.g. an arrangement of pixels (RGB stripe or pentile structure), or a size of each of the sub-pixels). For example, at least some pixels of the display 110 are driven based on the voltage value or the current value, so that visual information (e.g. text, image, or icon) corresponding to the image data is displayed through the display.

According to an embodiment, the display device 160 further includes a touch circuit 150. The touch circuit 150 includes a touch sensor 151 and a touch sensor IC 153 for controlling the touch sensor 151. For example, the touch sensor IC 153 controls the touch sensor 151 to detect a touch input or a hovering input in a specific location of the display 110. For example, the touch sensor IC 153 detects the touch input or the hovering input by measuring a change in a signal (e.g. a voltage, an amount of light, a resistance, or an amount of charge) in a specific location of the display 110. The touch sensor IC 153 provides information (e.g. a location, an area, a pressure, or a time) of the touch input or the hovering input to the processor 120. According to one embodiment, at least a part of the touch circuit 150 (e.g. touch sensor IC 153) is included in a part of the display driver IC 130 or the display 110, or in a part of other components (e.g. coprocessor 123) disposed outside the display device 160.

According to one embodiment, the display device 160 further includes at least one sensor of the sensor module 176 (e.g. a fingerprint sensor, an iris sensor, a pressure sensor or a light sensor) and a control circuit for the sensor. In this case, the sensor or the control circuit therefor is embedded in a part of the display device 160 (e.g. display 110 or DDI 130) or a part of the touch circuit 150. For example, when the sensor module 176 embedded in the display device 160 includes a biometric sensor (e.g. a fingerprint sensor), the biometric sensor acquires biometric information (e.g. a fingerprint image) associated with a touch input through a partial area of the display 110. Another example, when the sensor module 176 embedded in the display device 160 includes a pressure sensor, the pressure sensor acquires pressure information related to a touch input through a part or the entire area of the display 110. According to one embodiment, the touch sensor 151 or the sensor module 176 is disposed between pixels of a pixel layer of the display 110, or above or below the pixel layer.

Figure 2A:
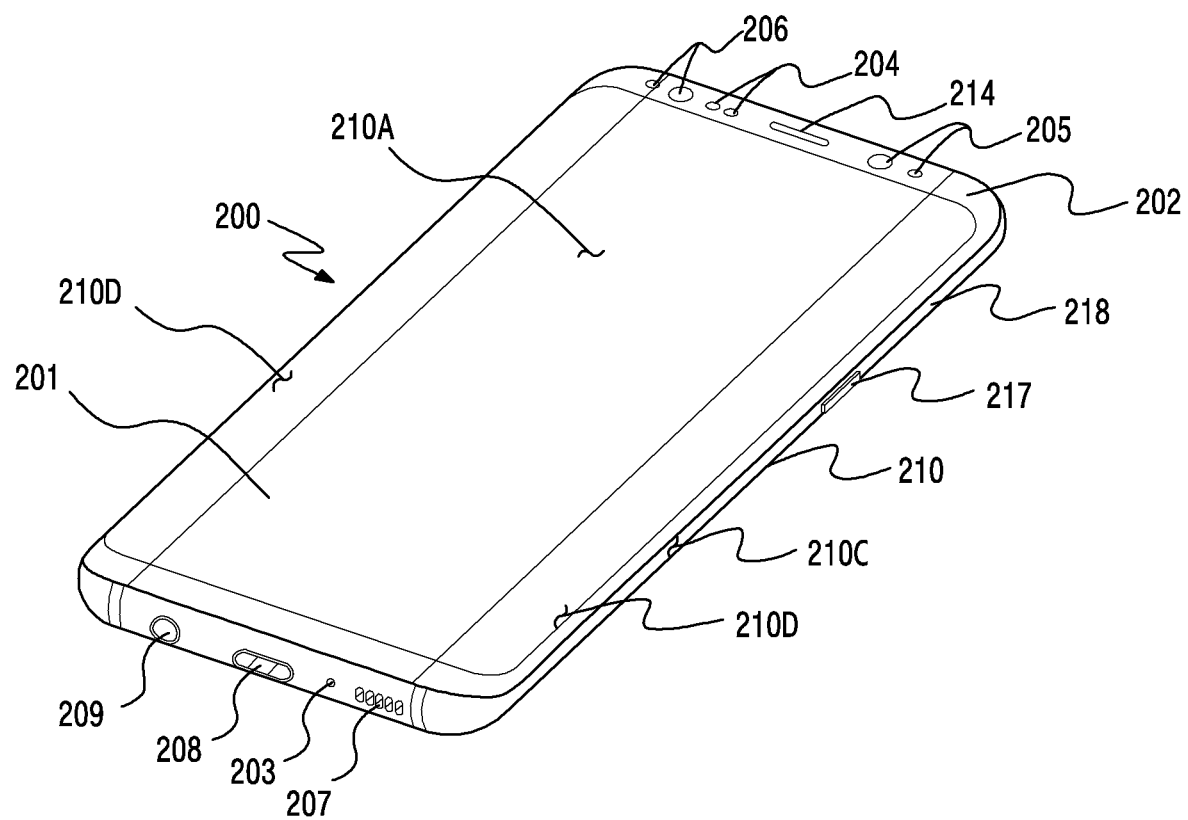
FIG. 2A is a perspective view illustrating a front surface of an electronic device according to various embodiments of the present disclosure.
Figure 2B:
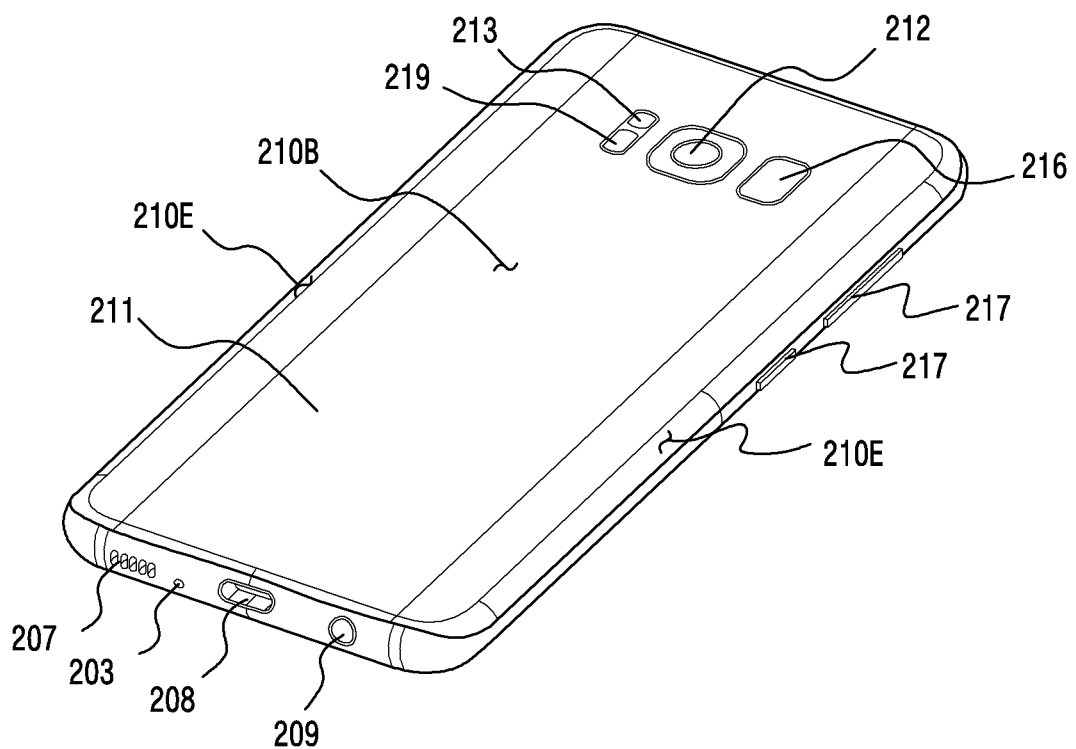
FIG. 2B is a perspective view showing a rear surface of the electronic device of FIG. 2A.

FIG. 2A is a front perspective view of a mobile electronic device according to an exemplary embodiment. FIG. 2B is a perspective view of the rear side of the electronic device of FIG. 2A.

Referring to FIG. 2a and FIG. 2b, an electronic device 200 according to an embodiment may include a housing 210 including a first face (or a front face) 210A, a second face (or a rear face) 210B, and a lateral face 210C surrounding a space between the first face 200A and the second face 210B. In another embodiment (not shown), the housing may refer to a construction which constitutes part of the first face 210A, second face 210B, and third face 210C of FIG. 2a. According to an embodiment, the first face 210A may be constructed of a front plate 202 (e.g., a polymer plate or a glass plate having various coating layers) which is at least partially transparent in practice. The second face 210B may be constructed of a rear plate 211 which is opaque in practice. For example, the rear plate 211 may be constructed of coated or colored glass, ceramic, polymer, metallic materials (e.g. aluminum, stainless steel (STS), or magnesium) or a combination of at least two of the these materials. The lateral face 210C may be constructed of a lateral bezel structure (or a lateral member) 218 bonded to the front plate 202 and the rear plate 211 and including metal and/or polymer. In some embodiments, the rear plate 211 and the lateral bezel structure 218 may be constructed integrally and may include the same material (e.g., a metallic material such as aluminum).

In the illustrated embodiment, the front plate 202 may include two first regions 210D seamlessly extended by being bent from the first face 210A toward the rear plate 211 at both ends of a long edge of the front plate 202. In the illustrated embodiment (see FIG. 2b), the rear plate 211 may include two second regions 210E seamlessly extended by being bent from the second face 210B toward the front plate 202 at both ends of a long edge. In some embodiments, the front plate 202 (or the rear plate 211) may include only one of the first regions 210D (or the second regions 210E). In another embodiment, some of the first regions 210D or the second regions 210E may not be included. In the above embodiments, in a lateral view of the electronic device 200, the lateral bezel structure 218 may have a first thickness (or width) at a lateral face in which the first regions 210D or the second regions 210E are not included, and may have a second thickness thinner than the first thickness at a lateral face in which the first regions 210E or the second regions 210E are included.

According to an embodiment, the electronic device 200 may include at least one or more of a display 201, audio modules 203, 207, and 214, sensor modules 204, 216, and 219, camera modules 205, 212, and 213, a key input device 217, a light emitting element 206, and connector holes 208 and 209. In some embodiments, the electronic device 200 may omit at least one of components (e.g., the key input device 217 or the light emitting element 206), or other components may be additionally included.

The display 201 may be exposed through, for example, some portions of the front plate 202. In some embodiments, at least a part of the display 201 may be exposed through the first face 210A and the front plate 202 constructing the first regions 210E of the lateral face 210C. In some embodiments, a corner of the display 201 may be constructed to be substantially the same as an outer boundary adjacent to the front plate 202. In another embodiment (not shown), in order to expand an area in which the display 201 is exposed, the display 210 and the front plate 202 may be constructed to have substantially the same interval between outer boundaries thereof.

In another embodiment (not shown), a part of a screen display region of the display 201 may have a recess or opening, and may include at least one or more of the audio module 214, sensor module 204, camera module 205, and light emitting element 206 which are aligned with the recess or the opening may be included. In another embodiment (not shown), at least one of the audio module 214, the sensor module 204, the camera module 205, the fingerprint sensor 216, and the light emitting element 206 may be included in a rear face of the screen display region of the display 201. In another embodiment (not shown), the display 201 may be disposed adjacent to or joined with a touch sensing circuit, a pressure sensor capable of measuring touch strength (pressure), and/or a digitizer for detecting a magnetic-type stylus pen. In some embodiments, at least a part of the sensor modules 204 and 219 and/or at least a part of the key input device 217 may be disposed to the first regions 210D and/or the second regions 210E.

The audio modules 203, 207, and 214 may include the microphone hole 203 and the speaker holes 207 and 214. The microphone hole 203 may have a microphone disposed inside thereof to acquire external sound, and in some embodiments, may have a plurality of microphones disposed to sense a sound direction. The speaker holes 207 and 214 may include the external speaker hole 207 and the communication receiver hole 214. In some embodiments, the speaker holes 207 and 214 and the microphone hole 203 may be implemented with one hole, or the speaker (e.g., a piezo speaker) may be included without the speaker holes 207 and 214.

The sensor modules 204, 216, and 219 may generate an electrical signal or data value corresponding to an internal operational state of the electronic device 200 or an external environmental state. The sensor modules 204, 216, and 219 may include, for example, the first sensor module 204 (e.g., a proximity sensor) and/or second sensor module (not shown) (e.g., a fingerprint sensor) disposed to the first face 210A of the housing 210, and/or the third sensor module 219 (e.g., a Heart Rate Monitoring (HRM) sensor) disposed to the second face 210B of the housing 210 and/or the fourth sensor module 216 (e.g., a fingerprint sensor). The fingerprint sensor may be disposed not only to the first face 210A (e.g., the display 201) but also the second face 210B of the housing 210. The electronic device 200 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 205, 212, and 213 may include the first camera device 205 disposed to the first face 210A of the electronic device 200, the second camera device 212 disposed to the second face 210B, and/or the flash 213. The camera module 205 and 212 may include one or more lenses, an image sensor, and/or an image signal processor. The flash 213 may include, for example, a Light Emitting Diode (LED) or a xenon lamp. In some embodiments, two or more lenses (wide angle and telephoto lenses) and image sensors may be disposed to one face of the electronic device 200.

The key input device 217 may be disposed to the lateral face 210C of the housing 210. In another embodiment, the electronic device 200 may not include the entirety or part of the aforementioned key input device 217. The key input device 217, which is not included, may be implemented on a display 201 in a different form such as a soft key or the like. In some embodiments, the key input device may include the sensor module 216 disposed to the second face 210B of the housing 210.

The light emitting element 206 may be disposed, for example, to the first face 210A of the housing 210. The light emitting element 206 may provide, for example, state information of the electronic device 200 in an optical form. In another embodiment, the light emitting element 206 may provide, for example, a light source interworking with an operation of the camera module 205. The light emitting element 206 may include, for example, an LED, an IR LED, and a xenon lamp.

The connector holes 208 and 209 may include the first connector hole 208 capable of housing a connector (e.g., a USB connector) for transmitting/receiving power and/or data of an external electronic device and/or the second connector hole (e.g., earphone jack) 209 capable of housing a connector for transmitting/receiving an audio signal with respect to the external electronic device.

Figure 3:
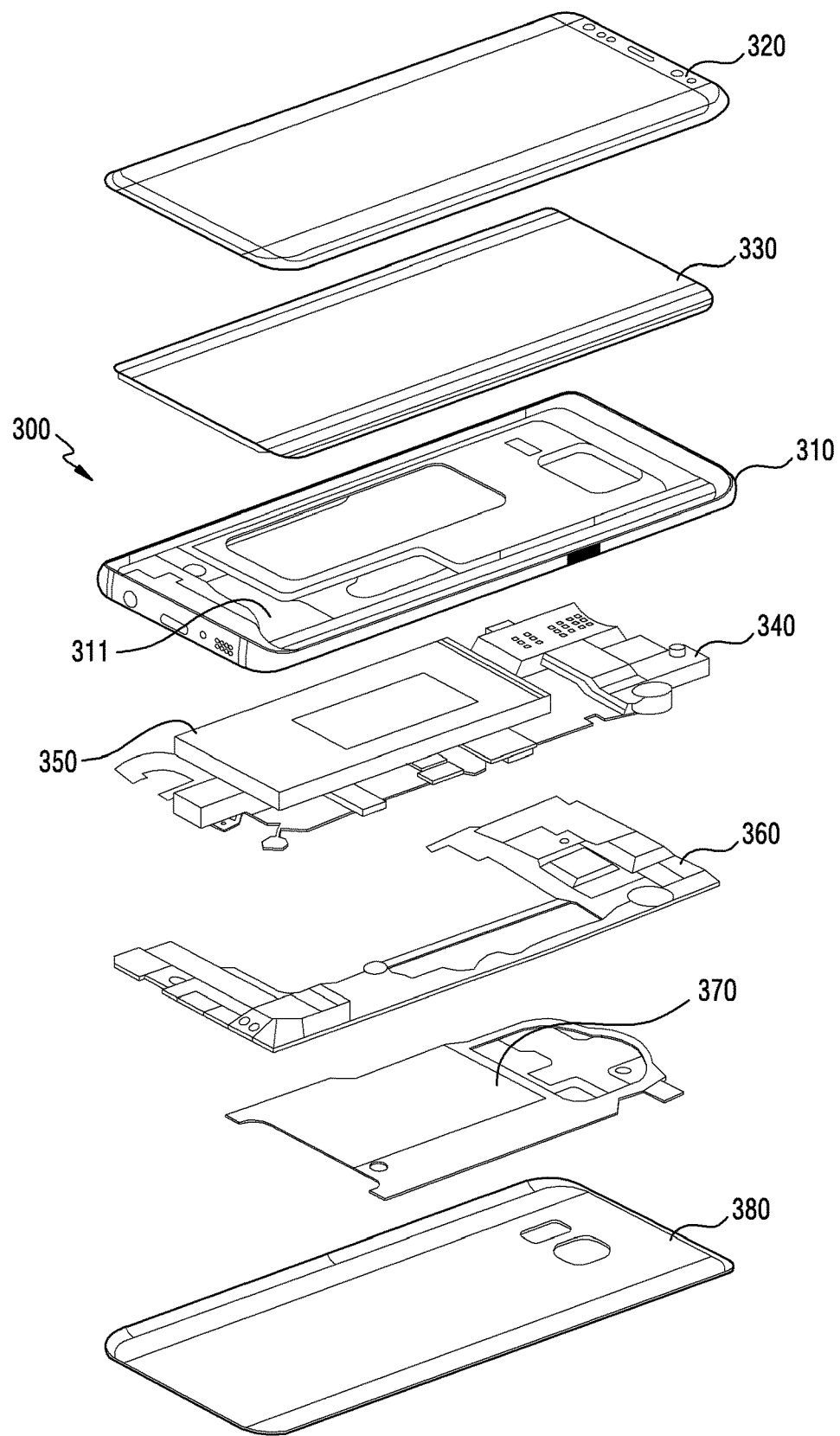
FIG. 3 is an exploded perspective view showing the internal structure of the electronic device of FIG. 2A.

Referring to FIG. 3, an electronic device 300 may include a lateral bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel construction 310 by being disposed inside the electronic device 300, or may be constructed integrally with respect to the lateral bezel construction 310. The first support member 311 may be constructed of, for example, a metal material and/or non-metal material (e.g., polymer). The display 330 may be bonded to one face of the first support member 311, and the printed circuit board 340 may be bonded to the other face thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, a non-rechargeable primary cell, a rechargeable secondary cell, or a fuel cell. At least a part of the battery 350 may be disposed on the same plane substantially with respect to, for example, the printed circuit board 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform NFC, for example, with the external electronic device, or may wirelessly transmit/receive power required for charging. In another embodiment, an antenna construction may be constructed by at least a part of the lateral bezel construction 310 and/or the first support member 311 or a combination thereof.

In the following, with reference to the accompanying drawings, a mounting structure of a step compensated sensor according to various embodiments of the present disclosure will be described.

Figure 4:
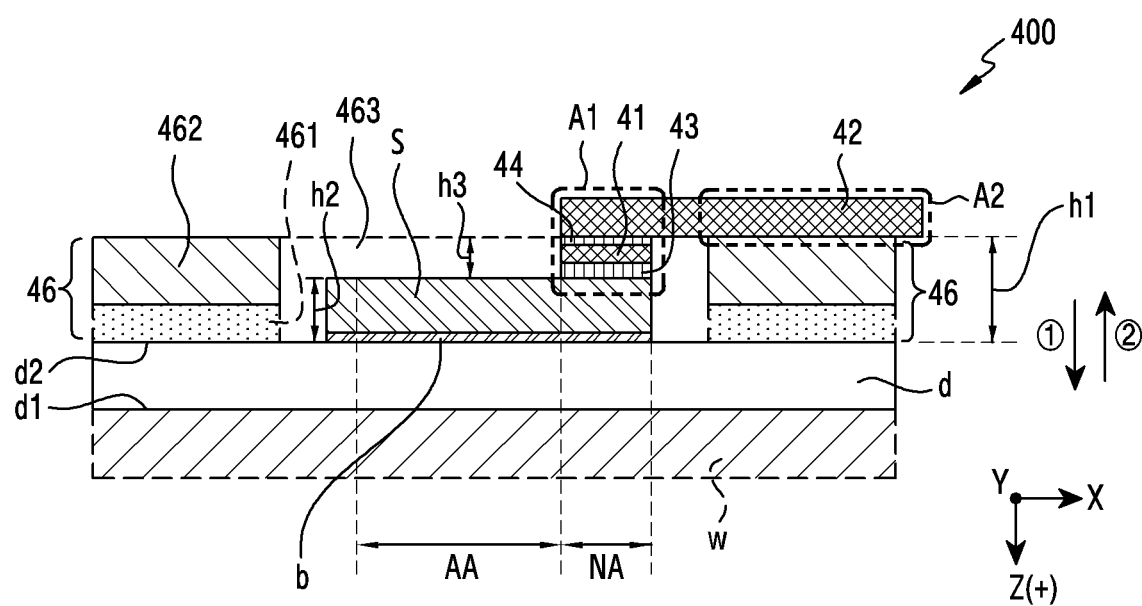
FIG. 4 to FIG. 15, each is a cross-sectional view illustrating a step compensation mounting structure of a sensor mounted in an electronic device according to various embodiments of the present disclosure.

Referring to FIG. 4, an electronic device 400 (e.g. the electronic device 200 in FIG. 2A) according to various embodiments of the present disclosure includes at least one sensor s using biometric information. For example, the sensor s (e.g. the sensor module 176 in FIG. 1) includes a fingerprint sensor.

The sensor s using biometric information according to various embodiments is mounted on a front side (e.g. under a window) or a rear side (e.g. a back cover) of the electronic device 400. When the sensor is mounted on the front surface of the electronic device 400, it is referred to as a front biometric information sensor, and when mounted on the rear surface of the electronic device 400, it is referred to as a rear biometric information sensor. For example, when the sensor is a fingerprint sensor, the sensor disposed in front of the electronic device 400 is referred to as a front fingerprint sensor, and the sensor disposed in a display in front of the electronic device 400 is referred to as an in-display type front fingerprint sensor.

The sensor according to various embodiments is an in-display type fingerprint sensor. The display panel d is mounted on the front or the rear surface of the electronic device 400, or is mounted on both the front surface and the rear surface.

The electronic device 400 according to various embodiments includes a window w, a display panel d, a sensor s, a flexible substrate 42, a sensor mounting portion 463, a sensor peripheral structure 46 and a connection member 41. The sensor s mounted on the electronic device 400 according to various embodiments, for example, a fingerprint sensor is mounted on the rear surface d2 of the display panel d using an adhesive. According to an embodiment, when the sensor s is a fingerprint sensor, the fingerprint sensor is an ultrasonic sensor. The sensor peripheral structure 46 according to various embodiments refers to a sheet structure in a layer type around the sensor s, and is referred to as a sheet layer. Further, since the connecting member 41 is a member that compensates for a step, it is referred to as a step compensation member.

The display panel d according to various embodiments includes a front surface d1 facing a first direction ① and a rear surface d2 facing a second direction ② opposite to the first direction ①. In the display panel d according to various embodiments, the window w is disposed on a front surface d1 in a first direction ①, and the sensor s, the sensor mounting portion 463, the sensor peripheral structure 46, and the connection member 41 are disposed on the rear surface d2 in a second direction ②. The window w according to various embodiments is a protection member disposed on the front surface of the housing of the electronic device 400 in the first direction OD and is made of a glass material or a synthetic resin material. The combination of the display panel d and the window w is referred to as a display.

The sensor peripheral structure 46 according to various embodiments is disposed in the second direction of the display panel d and functions as a reflecting member and a damping member of the display panel d, and includes a blocking member 461 and an elastic member 462. The blocking member 461 according to various embodiments is disposed on one surface of the display panel d in the second direction. The elastic member 462 is disposed on one surface of the blocking member 461 in the second direction. The sensor peripheral structure 46 has a first designated height h1 from the rear surface d2 of the display. For example, the elastic member 462 is made of a material of elastic deformation, and is disposed on one surface of the blocking member 461 in a sheet shape.

The sensor mounting portion 463 according to various embodiments is formed by cutting a part of the sensor peripheral structure 46 installed in the second direction ② of the display panel d. For example, the sensor mounting portion 463 is a space in which the sensor s is mounted, and is an opening. The sensor s is attached to the bottom surface d2 of the display panel by using an adhesive material in the sensor mounting portion 463.

The sensor s according to various embodiments is an in-display type front mounted fingerprint sensor and is attached in parallel to one surface of the display panel d in the second direction ②. The sensor s is disposed to be accommodated in the sensor mounting portion 463 and is electrically connected to a main printed circuit board, not shown, by the flexible substrate 42. The sensor s has a second designated height h2 from the rear surface d2 of the display. In addition, the sensor s is disposed in an inner space formed by a side surface of the sensor mounting portion (opening part) 463 having a first designated height h1 and a rear surface d2 of the display panel. The sensor s outputs ultrasonic waves through at least a portion of the display panel d, and obtains biometric information by receiving a reflected wave of the ultrasonic waves output from the sensor.

When the sensor s is mounted on the sensor mounting portion 463 according to various embodiments, a difference between the first height h1 of the sensor peripheral structure 46 and the second height h2 of the sensor s occurs. For example, the first height h1 of the sensor peripheral structure 46 is a height including the elastic member 462 and the blocking member 461. For example, the second height h2 of the sensor s is a thickness including the adhesive layer b. Accordingly, at least one connection member 41 is disposed in a step caused by a height difference between the height of the elastic member 462 and the height of the sensor s. The connecting member 41 is a structure, a device, or a member capable of compensating for a step caused by the height difference. The connection member 41 is disposed between the sensor s and the flexible substrate 42 in the sensor mounting portion 463. The connection member 41 according to various embodiments has a third designated height h3 capable of compensating for a difference between the first designated height h1 and the second designated heights h2. The third designated height h3 includes the thickness of the first electrode connection part 43 and the second electrode connection part 44.

The connection member 41 according to various embodiments includes at least one substrate. The substrate includes at least one or more first electrode connection part 43. At least one connecting member 41 is electrically connected to the sensor s by at least one or more first electrode connecting part 43 and bonded to the sensor s. For example, the connection member 41 includes a rigid printed circuit board (PCB) or a flexible printed circuit board (FPCB). The first electrode connection part 43 is formed of at least one layer.

The connection member 41 according to various embodiments includes first signal terminals on one surface and second signal terminals electrically connected to the first signal terminals on the other surface. The connection member 41 is electrically connected to the sensor s using the first signal terminals, and is electrically connected to the flexible substrate 42 using the second signal terminals.

At least one connection member 41 is electrically connected to the flexible substrate 42 by the second electrode connection part 44 and bonded to the flexible substrate 42. For example, the first electrode connection part 43 includes an anisotropic conductive film (ACF) or an anisotropic conductive member (ACM), and the second electrode connection part 44 includes ACF or jet solder. The second electrode connection part 44 is formed of at least one or more layers.

The sensor s according to various embodiments is electrically connected to the connection member 41 by the first electrode connection part 43, and the connection member 41 is electrically connected to the flexible substrate 42 by the second electrode connection part 44. The flexible substrate 42 is disposed substantially horizontally with the sensor s by the connecting member 41.

The connection member 41 according to various embodiments is located in a first area (A1) that is inside the sensor mounting portion 463, and the flexible substrate 42 is disposed in a second area (A2) that is outside the sensor mounting portion 463. The flexible substrate 42 is placed on or in close contact with one surface of the elastic member 462 in the second direction.

In the electronic device according to various embodiments, when viewed from the top of one surface of the sensor s, the connection member 41 is disposed to overlap with at least a portion of the sensor s, and is disposed to overlap with a part of the flexible substrate 42. The sensor s, the connection member 41 and one part of the flexible substrate 42 are stacked on each other. The connection member 41 according to various embodiments is disposed not to overlap with the active area (AA) of the sensor s when viewed from above the sensor s, and is disposed to overlap at least a portion of the inactive area (NA) of the sensor s.

Figure 5:
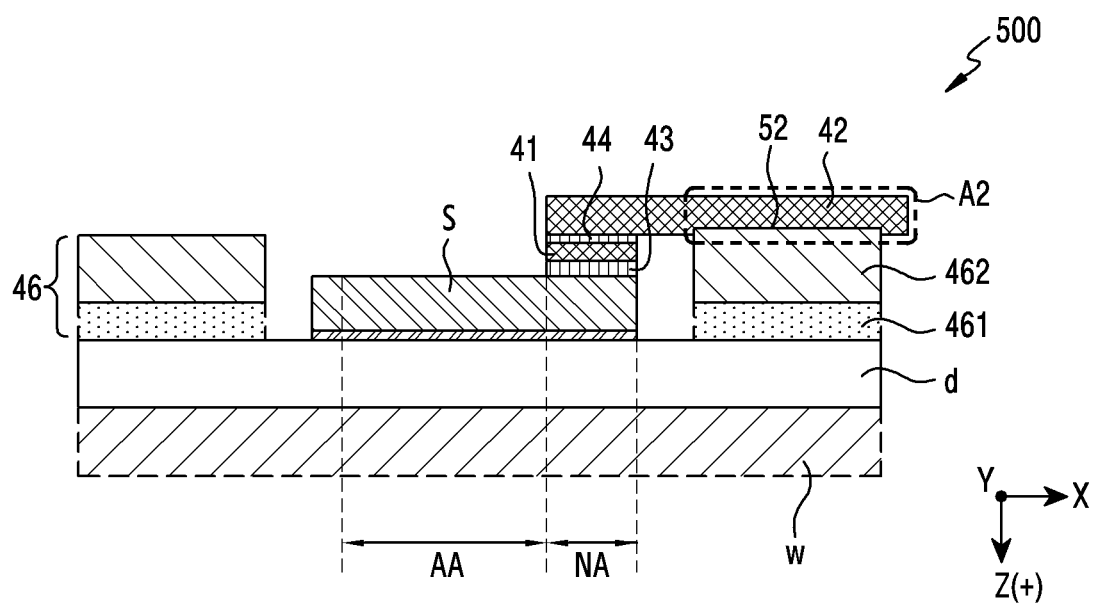

Referring to FIG. 5, the electronic device 500 (e.g. the electronic device 200 in FIG. 2A) according to various embodiments describes only different configurations and avoids redundant description of the same configuration as compared to the electronic device 400 illustrated in FIG. 4. The electronic device 500 according to various embodiments, compared to the electronic device 400 illustrated in FIG. 4, additionally includes a step compensation structure 52.

The step compensation structure 52 according to various embodiments is formed in a region where the flexible substrate 42 and the elastic member 462 come into close contact with each other. For example, the step compensation structure 52 is formed by removing a cover layer of at least a partial region (e.g. a close contact region) facing the elastic member 462 among a plurality of layers included in the flexible substrate 42. For example, the step compensation structure 52 has an opening, a recess, or a groove shape.

When the cover layer is removed in the contact area of the flexible substrate 42 to provide a recess such as an opening, a part of the elastic member 462 is accommodated in the recess, thereby providing compensation for a step difference of the flexible substrate 42. The step compensation structure 52 is formed between the contact region of the flexible substrate 42 and one surface of the elastic member 462 facing the second direction. In the flexible substrate 42, a portion to which the step compensation structure 52 is applied has the thinnest thickness.

In the electronic device 500 according to various embodiments, when viewed from above one surface of the sensor s, the step compensation structure 62 is not disposed to overlap with at least a part of the sensor s, but is disposed to overlap with the elastic member 462. The step compensation structure 52 according to various embodiments is disposed not to overlap with the active area (AA) of the sensor s when viewed from above the sensor s.

Figure 6:
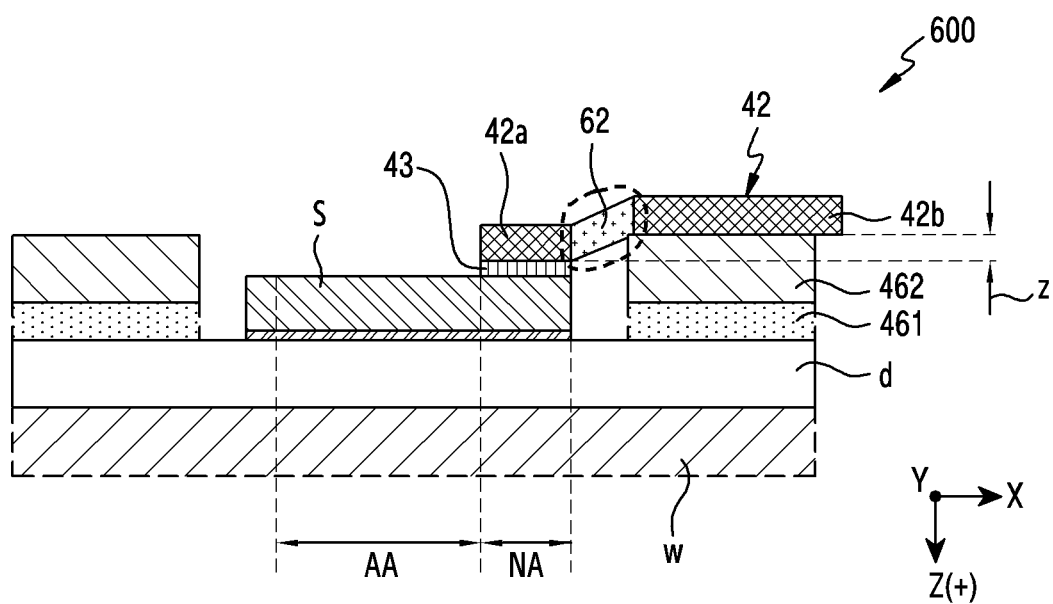

Referring to FIG. 6, the electronic device 600 (e.g. the electronic device 200 in FIG. 2A) according to various embodiments describes only different configurations and avoids redundant description of the same configuration as compared to the electronic device 400 illustrated in FIG. 4. The electronic device 600 according to various embodiments is configured to have a different step compensation structure compared to the electronic device 500 illustrated in FIG. 5.

The step compensation structure 62 according to various embodiments is formed on at least a part of the flexible substrate 42. When the flexible substrate 42 is mounted, one end 42a of the flexible substrate 42 is connected to the sensor s by the first electrode connection part 43, and the other end 42b is placed on one side of the elastic member 462. Here, the step compensation structure 62 is applied to the height difference occurring between the one end 42a and the other end 42b of the flexible substrate 42.

The step compensation structure 62 according to various embodiments is formed between the one end 42a and the other end 42b of the flexible substrate 42 and is formed by 3D (Dimensional) forming. The step compensation structure 62 has a curved shape and maintains a curved state, thereby preventing elastic shaking of the flexible substrate 42 due to a step difference caused by a height difference z.

The step compensation structure 62 according to various embodiments is disposed not to overlap with the active area (AA) and the non-active area (NA) of the sensor s when viewed from above the sensor s.

Figure 7:
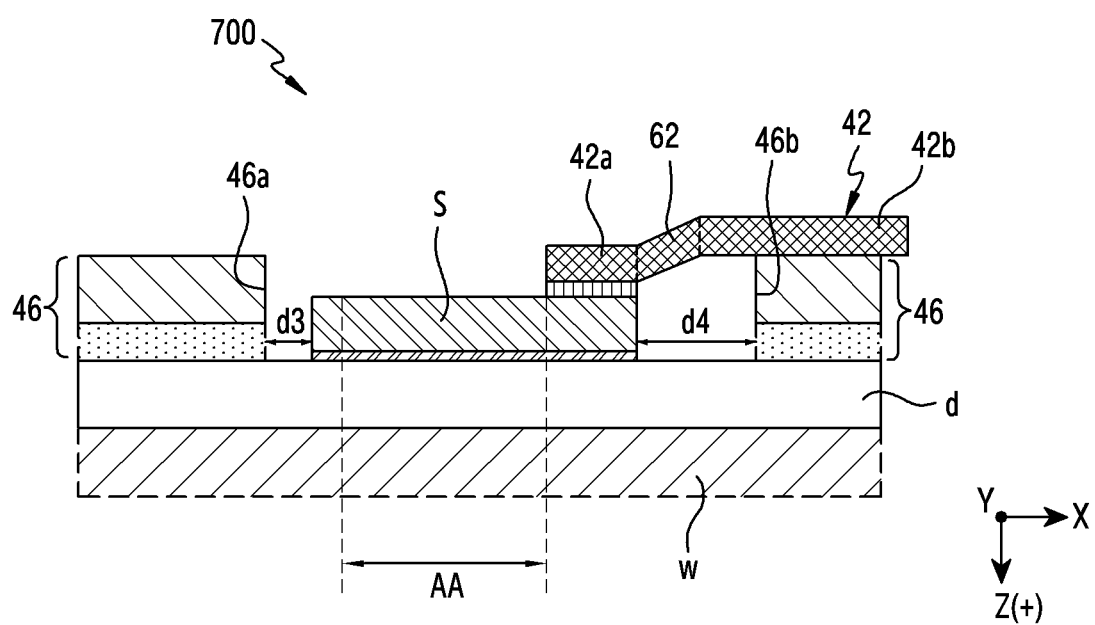

Referring to FIG. 7, an electronic device 700 (e.g. the electronic device 200 in FIG. 2A) according to various embodiments describes only different configurations compared to the electronic device 600 illustrated in FIG. 6 and avoids redundant description of the same configuration as compared to the electronic device 600 illustrated in FIG. 6. The electronic device 700 according to various embodiments has a different mounting position of the sensor s compared to the electronic device 600 illustrated in FIG. 6.

The step compensation structure included in the electronic device 700 according to various embodiments is implemented by changing the mounting position of the sensor s. The sensor s according to various embodiments is mounted on the sensor mounting portion 463 formed in the sensor peripheral structure 46, and is arranged to be skewed in one direction.

For example, the sensor s is disposed at a position closer to the one side wall 46a between the one side wall 46a and the other side wall 46b of the sensor mounting portion 463. That is, a distance d3 between one side wall 46a and one surface of the sensor s is smaller than a distance d4 between the other side wall 46b and the other surface of the sensor s. According to the arrangement of the sensor s skewed to one side, the step difference between a part of the flexible substrate 42 and the other part of the flexible substrate 42 is alleviated, so that the lifting of the sensor s or the flexible substrate 42 is prevented.

Figure 8:
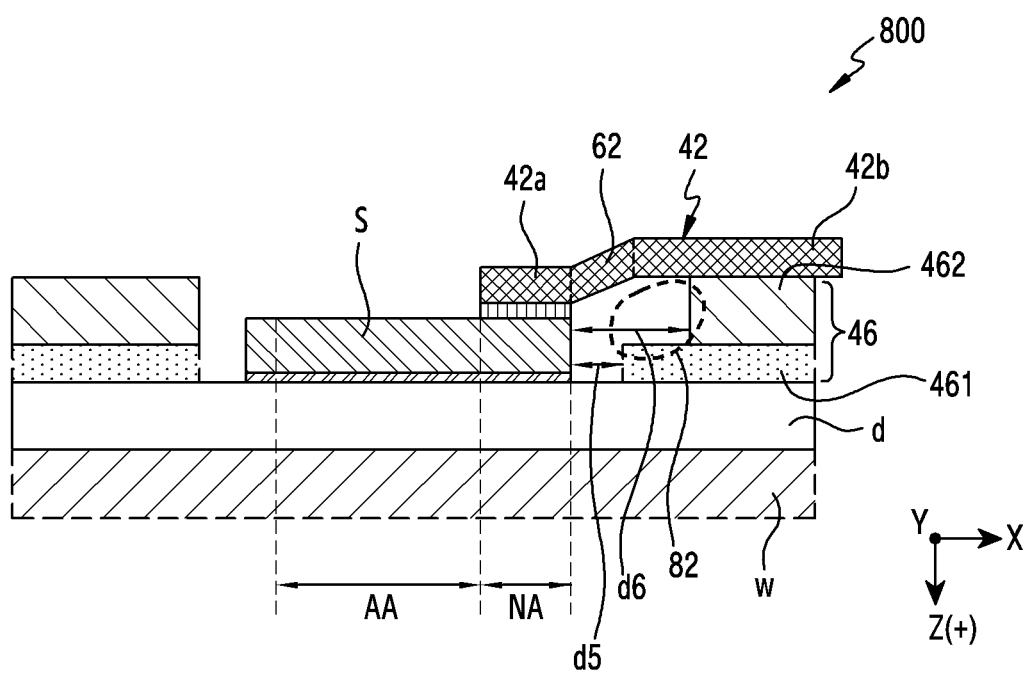

Referring to FIG. 8, an electronic device 800 (e.g. the electronic device 200 of FIG. 2A) according to various embodiments describes only different configurations compared to the electronic device 600 in FIG. 6, and avoids redundant description of the same configuration as compared to the electronic device 600 illustrated in FIG. 6. The electronic device 800 according to various embodiments has a different structure of the sensor peripheral structure 46 compared to the electronic device 600 illustrated in FIG. 6.

The step compensation structure 82 included in the electronic device according to various embodiments provides a stepped portion to the sensor peripheral structure 46 in close contact with the other end 42b of the flexible substrate 42, and alleviates stress generated by the step difference between the one end 42a and the other end 42b of the flexible substrate 42.

The step compensation structure 82 according to various embodiments removes a part of the elastic member 462, facing other side of the sensor, which is in close contact with the other end 42b of the flexible substrate 42, and thus a stepped portion is provided in the elastic member 462. The step difference between the one end 42a and the other end 42b of the flexible substrate 42 is alleviated by the stepped portion, so that the occurrence of local stress on the flexible substrate 42 is reduced. The step compensation structure 82 according to various embodiments is disposed not to overlap with the active area (AA) and the inactive area (NA) of the sensor s when viewed from above the sensor s.

At least a partial region of the opening of the blocking member 461 according to various embodiments is spaced apart from the side surface of the fingerprint sensor s by a first designated distance d5, and at least a partial region of the opening of the elastic member 462 is spaced apart from the side surface of the fingerprint sensor s by a second designated distance d6 that is greater than the first designated distance d5.

Figure 9:
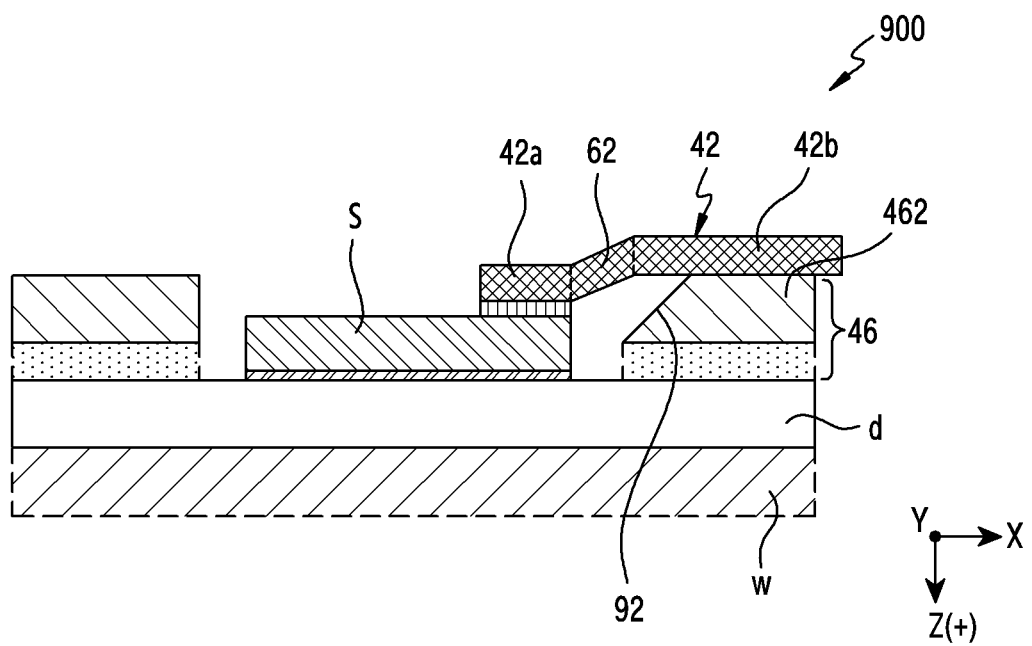

Referring to FIG. 9, an electronic device 900 (e.g. the electronic device 200 of FIG. 2A) according to various embodiments describes only different configurations compared to the electronic device 600 illustrated in FIG. 6 and avoids redundant description of the same configuration as compared to the electronic device 600 illustrated in FIG. 6. The electronic device 900 according to various embodiments has a different structure of the sensor peripheral structure 46 compared to the electronic device 600 illustrated in FIG. 6.

The step compensation structure 92 included in the electronic device 900 according to various embodiments has an inclined portion formed by cutting inclinedly a part of the elastic member 462 that is in close contact with the other end 42b of the flexible substrate 42 and faces the other side of the sensor s. The step difference between the one end portion 42a and the other end portion 42b of the flexible substrate 42 is alleviated by the inclined portion, so that the sensor s or the flexible substrate 42 is prevented from being lifted. The step compensation structure according to various embodiments is disposed not to overlap with the active area (AA) and the inactive area (NA) of the sensor s when viewed from above the sensor s.

Figure 10:
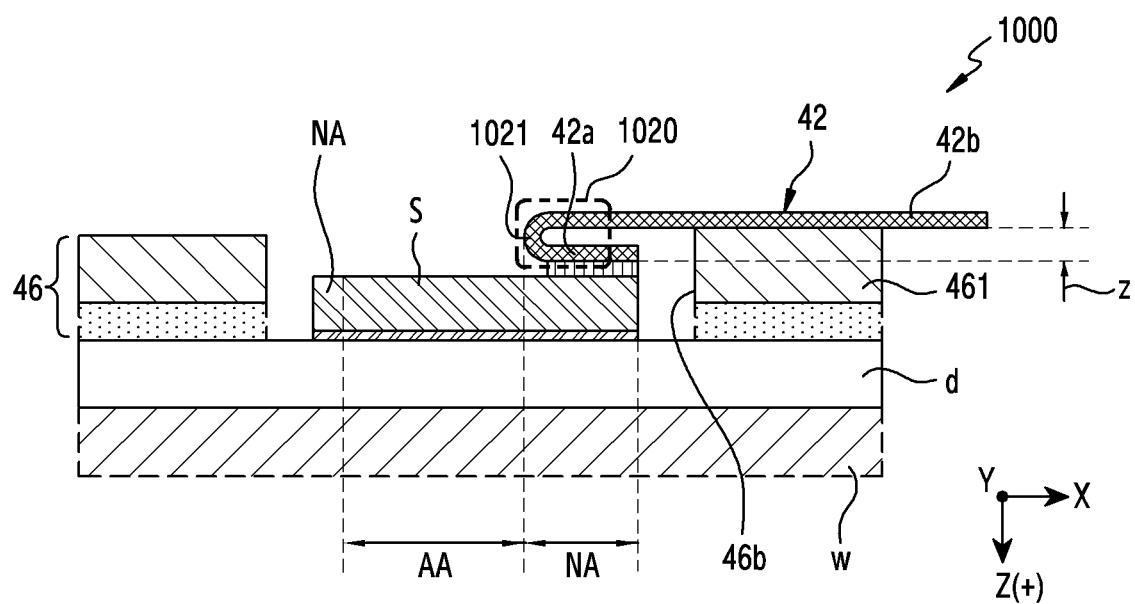

Referring to FIG. 10, an electronic device 1000 (e.g. the electronic device 200 of FIG. 2A) according to various embodiments describes only different configurations compared to the electronic device 400 illustrated in FIG. 4 and avoids redundant description of the same configuration as compared to the electronic device 400 illustrated in FIG. 4. The electronic device 1000 according to various embodiments has a different structure of the sensor peripheral structure 46 compared to the electronic device 400 illustrated in FIG. 6.

The step compensation structure 1020 included in the electronic device 1000 according to various embodiments is disposed in an inactive area (NA) that does not overlap with the active area (AA) of the sensor s when viewed from the top of the sensor s. For example, it is disposed in at least one or more edge areas of the sensor s. In the sensor s, an active area (AA) is disposed in a central area, and an inactive area (NA) is disposed around the central area. The step compensation structure 1020 is located in the non-active area (NA) so as not to affect the performance of the sensor s.

The step compensation structure 1020 according to various embodiments is located in an edge region adjacent to the other side wall 46*b*. The step compensation structure 1020 is formed by bending, at least once, a part of the flexible substrate 42. In the step compensation structure 1020, one end 42*a* is attached to the inactive region (NA) of the sensor s by the first electrode connection part 43, and the bending portion 1021 in contact with the one end 42*a* is included. The other end 42*b* of the flexible substrate 42 is directed to the elastic member 462 by the bending portion 1021.

The flexible substrate 42 according to various embodiments prevents elastic shaking of the flexible substrate 42 by the step compensation structure 1020. The step z between the one end 42*a* and the other end 42*b* of the flexible substrate 42 is alleviated by this bending portion 1021, so that the lifting phenomenon of the sensor s or the flexible substrate 42 is prevented.

Figure 11:
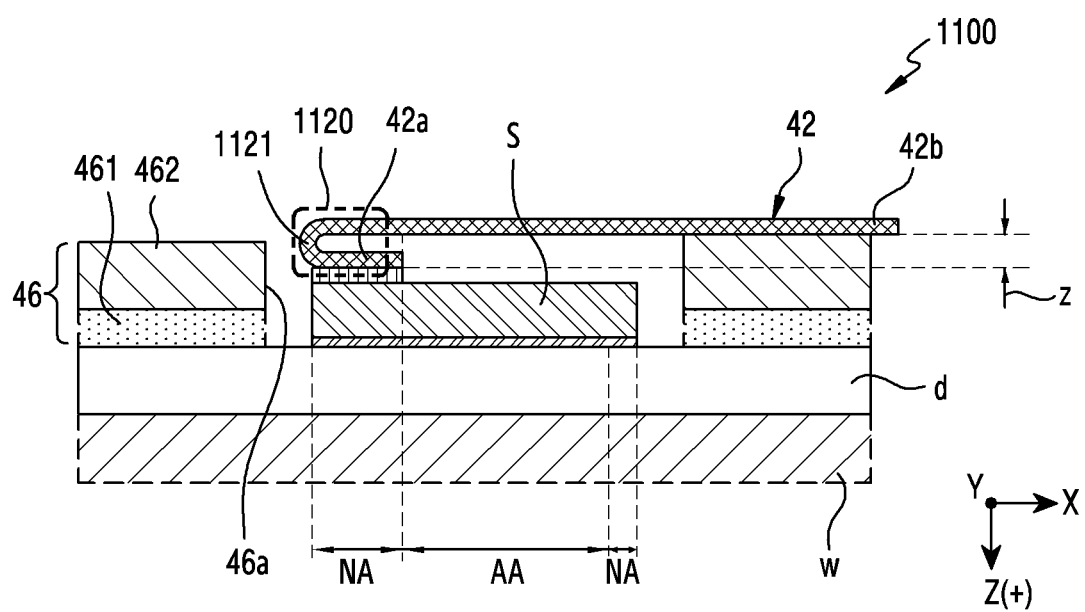

Referring to FIG. 11, an electronic device 1100 (e.g. the electronic device 200 of FIG. 2A) according to various embodiments describes only different configurations compared to the electronic device 1000 illustrated in FIG. 10 and avoids redundant description of the same configuration as compared to the electronic device 1000 illustrated in FIG. 10. Compared to the electronic device 1000 illustrated in FIG. 10, the electronic device 1100 according to various embodiments has a different arrangement position of the step compensation structure 1120.

The step compensation structure 1120 included in the electronic device 1100 according to various embodiments of the present disclosure is disposed in an inactive area (NA) that does not overlap with the active area (AA) of the sensor s when viewed from the top of the sensor s. For example, it is disposed in at least one or more edge areas of the sensor s. In the sensor s, an active area (AA) is disposed in a central area, and an inactive area (NA) is disposed in an edge area around the central area.

The step compensation structure 1120 according to various embodiments is located in an edge region facing the one side wall 46*a*. The step compensation structure 1120 is formed by bending, at least once, a portion of the flexible substrate 42. In the step compensation structure 1120, one end 42*a* is attached to the inactive region (NA) of the sensor s by the first electrode connection part 43, and the bending portion 1121 in contact with the one end 42*a* is included. The other end 42*b* of the flexible substrate 42 crosses the sensor s by the bent portion 1121 toward the elastic member 462. The step z between the one end 42*a* and the other end 42*b* of the flexible substrate 42 is alleviated by the bending portion 1121, so that the lifting phenomenon of the sensor s or the flexible substrate 42 is prevented.

The step compensation structure 1120 according to various embodiments is disposed not to overlap with the active area (AA) of the sensor s and is disposed to overlap with the inactive area (NA) when viewed from above the sensor s.

Figure 12:
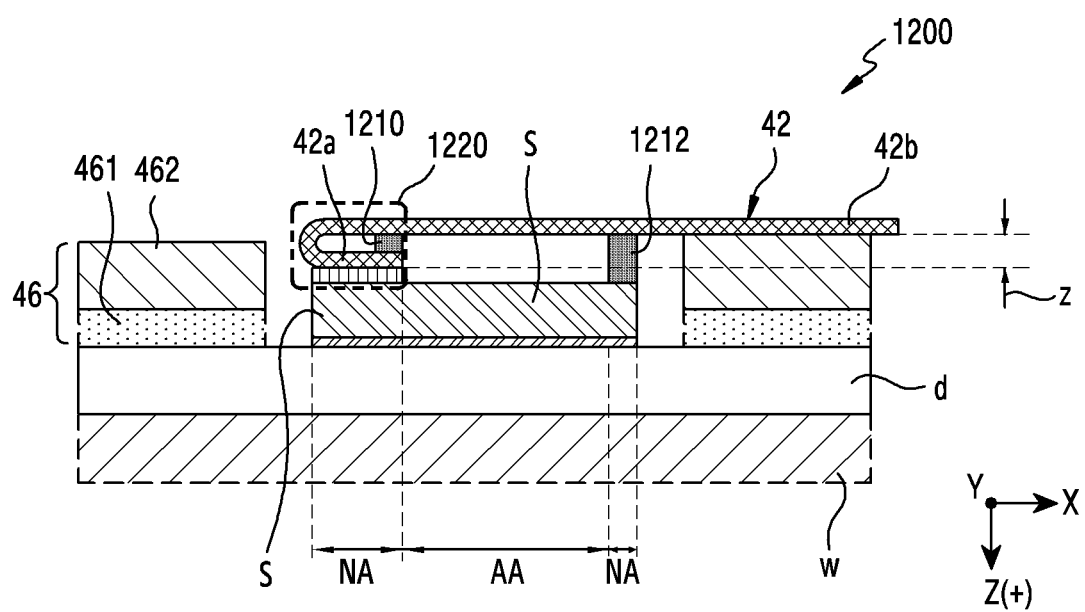

Referring to FIG. 12, an electronic device 1200 (e.g. the electronic device 200 of FIG. 2A) according to various embodiments describes only different configurations, compared to the electronic device 1100 illustrated in FIG. 11 and avoids redundant description of the same configuration as compared to the electronic device 1100 illustrated in FIG. 11. In the electronic device 1200 according to various embodiments, compared to the electronic device 1100 illustrated in FIG. 11, a spacer is additionally disposed.

The electronic device including the step compensation structure 1220 according to various embodiments includes at least one spacer 1210 and 1212 for maintaining the state of the step compensation structure 1220 in order to secure an air gap for preventing interference of the sensor s, for example, an ultrasonic sensor.

At least one spacer 1210 and 1212 according to various embodiments is disposed to overlap with the inactive area (NA) of the sensor s when viewed from above the sensor s. The spacer includes a first spacer 1210 disposed in an area overlapped with the inactive region (NA) between one end 42*a* and the other end 42*b* of the flexible substrate 42 and a second spacer 1212 disposed in an area overlapped with the inactive region (NA) between the other end 42*b* and the other end of sensor s. The state of the flexible substrate 42 bent by the first spacer 1210 and the second spacer 1212 is supported, and an air gap is secured and the secured air gap is maintained.

Figure 13:
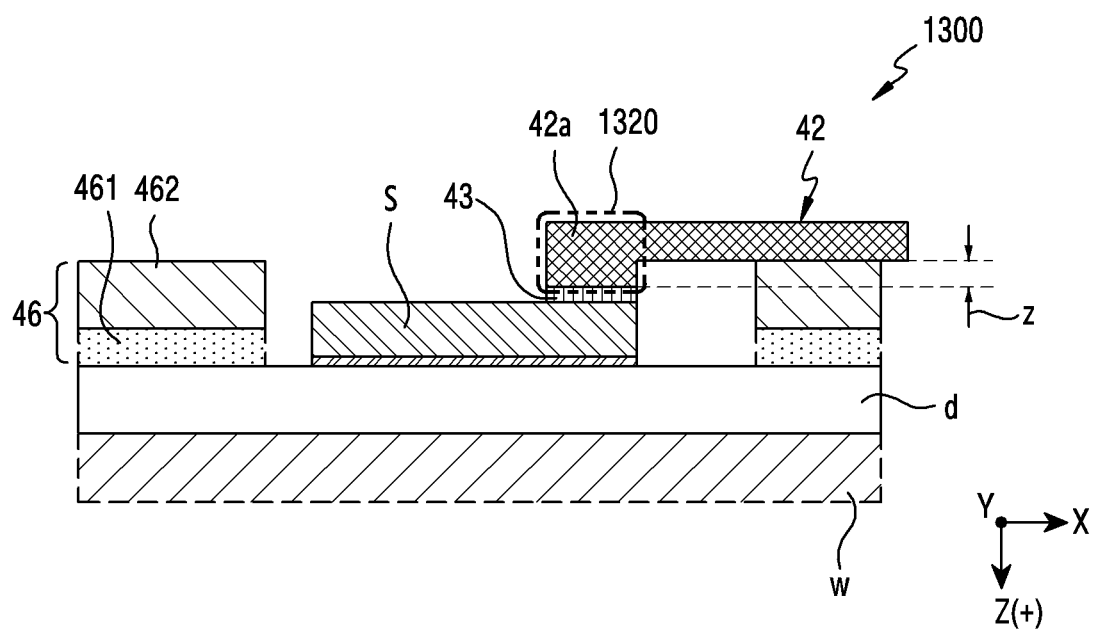

Referring to FIG. 13, compared to the electronic device 400 of FIG. 4, an electronic device 1300 (e.g. the electronic device 200 of FIG. 2A) according to various embodiments describes only different configurations, and the configuration for the same or similar elements will be omitted to avoid redundant description. In the electronic device 1300 according to various embodiments, compared to the electronic device 400 illustrated in FIG. 4, a step compensation structure 1320 is formed.

In the step compensation structure 1320 according to various embodiments, at least a part of the one end 42*a* of the flexible substrate 42 is configured as a differential layer. For example, the flexible substrate 42 includes a plurality of layers, and one end 42*a* has a larger layer structure than the other end 42*b* among the plurality of layers so that it compensates for the step z between the one end 42*a* and the other end 42*b*. The step compensation structure 1320 is electrically connected to and attached to the sensor s by the first electrode connection part 43.

Figure 14:
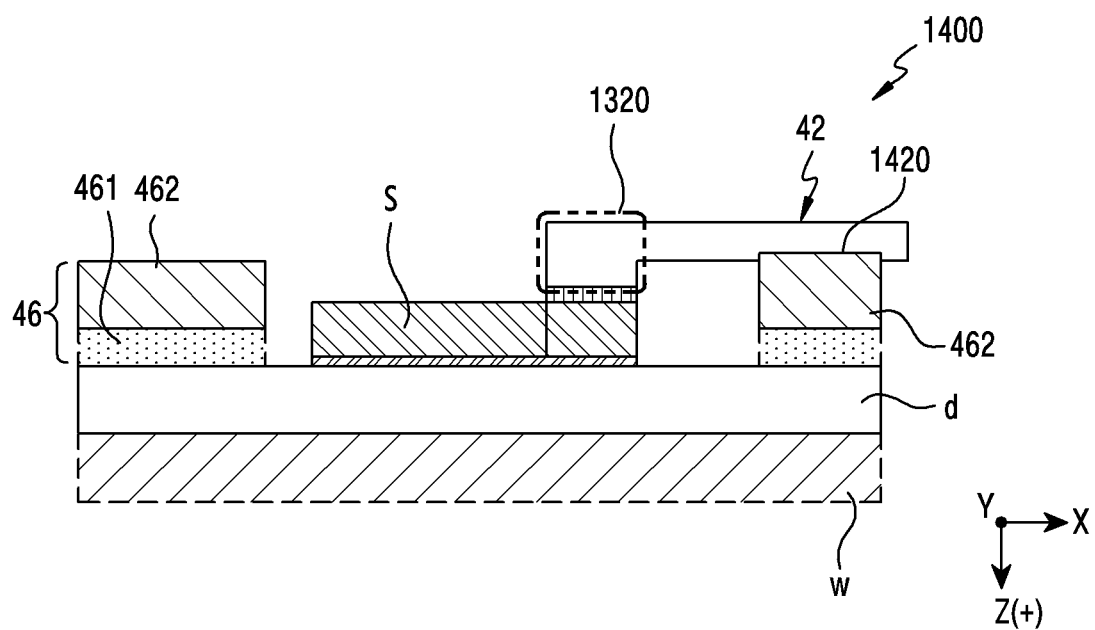

Referring to FIG. 14, as compared to the electronic device 1300 of FIG. 13, an electronic device 1400 (e.g. the electronic device 200 of FIG. 2A) according to various embodiments describes only different configurations, and the configuration for the same or similar elements will be omitted to avoid redundant description. In the electronic device 1400 according to various embodiments, compared to the electronic device 1300 illustrated in FIG. 13, a step compensation structure is additionally formed.

The step compensation structure 1420 according to various embodiments is formed in a region where the flexible substrate 42 and the elastic member 462 come into close contact with each other. For example, the step compensation structure 1420 is formed by removing a cover layer of at least a portion (e.g. a close contact area) of the plurality of layers included in the flexible substrate 42 that faces the elastic member 462. When an empty space is provided by removing the cover layer in the contact area of the flexible substrate 42, a part of the elastic member 462 is accommodated, thereby providing compensation for a step difference of the flexible substrate 42. The step compensation structure 1420 is formed between the contact region of the flexible substrate 42 and one surface of the elastic member 462. The flexible substrate 42 has the thinnest thickness in the contact area. For example, the step compensation structure 1420 is formed in any one of an opening, a recess, or a groove.

In the electronic device according to various embodiments, the step compensation structure 1420 is not disposed to overlap with at least a part of the sensor s, but is disposed to overlap with the sensor peripheral structure 46 when viewed from the top of one surface of the sensor s. The step compensation structure 1042 according to various embodiments is disposed not to overlap with the active area (AA) and the inactive area NA of the sensor s when viewed from above the sensor s.

Figure 15:
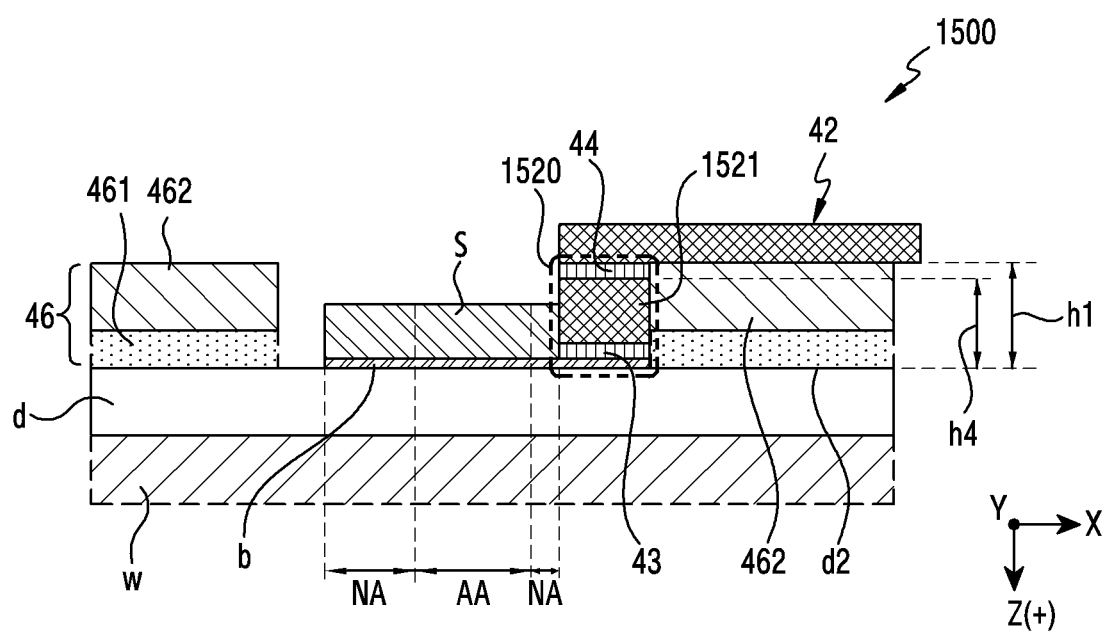

Referring to FIG. 15, compared to the electronic device 400 of FIG. 4, an electronic device 1500 (e.g. the electronic device 200 of FIG. 2A) according to various embodiments describes only different configurations, and the configuration for the same or similar elements will be omitted to avoid redundant description. The electronic device 1500 according to various embodiments has a different configuration of the step compensation structure 1520 compared to the electronic device 400 illustrated in FIG. 4.

The step compensation structure 1520 according to various embodiments is mounted on the sensor s in a space between the side surface of the sensor s and the sensor peripheral structure 46. The step compensation structure 1520 includes at least one substrate 1521. For example, the substrate 1521 includes an FPCB or a PCB. The thickness of the substrate 1521 is equal to or greater than the thickness of the flexible substrate 42.

The sensor s according to various embodiments is electrically connected to the substrate 1521 by the first electrode connection part 43, and is electrically connected to the flexible substrate 42 by the second electrode connection part 44.

The step compensation structure 1520 according to various embodiments has a fourth designated height h4 from the rear surface d2 of the display panel. For example, the fourth designated height h4 includes the thickness of the adhesive layer b or the thickness of the first electrode connection parts 43 and the second electrode connection part 44.

In the electronic device 1500 according to various embodiments, when viewed from above one surface of the sensor s, the step compensation structure 1620 is not disposed to overlap at least a part of the sensor s, and does not overlap with the elastic member 462. The step compensation structure 1550 according to various embodiments is disposed not to overlap with the active area (AA) and the non-active area (NA) of the sensor s when viewed from above the sensor s.

According to various embodiments of the present disclosure, an electronic device (e.g. the electronic device 100 in FIG. 1) comprises a display panel (e.g. the display panel d in FIG. 4) including a front surface (e.g. the front surface d1 of the display panel in FIG. 4) and a rear surface (e.g. the rear surface d2 of the display in FIG. 4); an opening (e.g., the sensor mounting portion 463 in FIG. 4); an elastic member (e.g. the elastic member 462 in FIG. 4) disposed on the rear surface having a first designated height (e.g. the specified height h1 in FIG. 4); a sensor (e.g. sensor s in FIG. 4), having a second designated height h2 (e.g. the second designated height h2 in FIG. 4) lower than the first specified height, disposed in an inner space formed by the side surface of the opening having the first designated height and the rear surface of the display panel; the connection member (e.g. the connection member 41 in FIG. 4), electrically connected to the sensor s (e.g. the sensor s in FIG. 4), disposed above the sensor and having a third designated height h3 (e.g. the third designated height in FIG. 4) compensating for the difference between the first designated height and the second designated height; and a flexible substrate (e.g. flexible substrate 42 in FIG. 4) electrically connected to the connection member (e.g. the connection member 41 in FIG. 4) in the opening and disposed under or above the elastic member (e.g. the elastic member 462 in FIG. 4).

According to various embodiments of the present disclosure, a connection member (e.g. the connection member 41 in FIG. 4) includes first signal terminals on one surface and second signal terminals electrically connected to the first signal terminals on the other surface, and is electrically connected to the sensor s (e.g. sensor s in FIG. 4) using the first signal terminals, and electrically connected to the flexible substrate (e.g. flexible substrate 42 in FIG. 4) using the second signal terminals.

According to various embodiments of the present disclosure, the connection member includes an FPCB or a rigid PCB.

According to various embodiments of the present disclosure, an anisotropic conductive member (e.g. the first electrode connection part 43 in FIG. 4) disposed between a connection member (e.g. the connection member 41 in FIG. 4), a sensor s (e.g. a sensor s in FIG. 4) and a flexible substrate (e.g. the flexible substrate 42 in FIG. 4) is further included and wherein the connection member is electrically connected to the sensor and the flexible conductive member by the anisotropic conductive member.

According to various embodiments of the present disclosure, the connecting member (e.g. the connecting member 41 in FIG. 4) and the anisotropic conductive member (e.g. the first electrode connection part 43 in FIG. 4) are stacked and disposed on the sensor (e.g. sensor s shown in FIG. 4) to have a fourth designated height for compensating for a difference between the first designated height and the second designated height.

According to various embodiments of the present disclosure, the sensor s (e.g. the sensor s in FIG. 4) includes an ultrasonic fingerprint sensor, and the fingerprint sensor outputs ultrasonic waves through at least a portion of the display panel, and biometric information is obtained by receiving the reflected wave of the ultrasonic wave which is output from the fingerprint sensor.

According to various embodiments of the present the disclosure, the sensor s (e.g. the sensor s in FIG. 4) includes an active area (e.g. the active area (AA) in FIG. 4) and an inactive area (e.g. the non-active area (NA) in FIG. 4), and the connection member (e.g. the connection member 41 in FIG. 4) is disposed in at least a portion of the inactive area (NA).

According to various embodiments of the present disclosure, one end of the flexible substrate (e.g. the flexible substrate 42 in FIG. 4) is disposed to overlap with the connection member (e.g. the connection member 41 in FIG. 4), and the other end portion 42b of the flexible substrate (e.g. the flexible substrate 42 in FIG. 4) is disposed to overlap with the elastic member (e.g. the elastic member 462 in FIG. 4).

According to various embodiments of the present disclosure, a blocking member (e.g. the blocking member 461 in FIG. 4) disposed between the elastic member (e.g. the elastic member 462 in FIG. 4) and the rear surface of the display panel are further included.

According to various embodiments of the present disclosure, the connecting member (e.g. the connecting member 41 in FIG. 4) is disposed on the rear surface of the display panel in the space between the side surface of the sensor s (e.g. the sensor s in FIG. 4) and the elastic member (e.g. the elastic member in FIG. 4).

According to various embodiments of the present disclosure, an electronic device (e.g. the electronic device 200 in FIG. 2A) according to various embodiments of the present disclosure comprises a housing (e.g. the housing 110 in FIG. 2A) including a first plate, a second plate facing a second direction opposite to a first direction and side members (e.g. side members 118 in FIG. 2A) surrounding at least a part of the space between the first plate and the second plate; a display panel (e.g. the display panel d in FIG. 4)) including a front surface facing the first direction and a rear surface facing a second direction opposite to the first direction, and disposed in the second direction on at least a portion of the first plate; at least one sheet layer (e.g. the peripheral structure 46 in FIG. 4) disposed on the rear surface of the display panel in the second direction and having an opening formed in at least a portion of the one sheet layer; a fingerprint sensor (e.g. sensor s in FIG. 4) disposed in contact with the rear surface of the display through the opening; a flexible substrate (e.g. the flexible substrate 42 in FIG. 4) having at least a portion overlapped with the fingerprint sensor and at least a portion overlapped with the at least one sheet layer; a step compensation member (e.g. the connection member 41 in FIG. 4) disposed between the fingerprint sensor and the flexible substrate, electrically connecting the fingerprint sensor and the flexible substrate, and compensating for a step difference caused by a height difference between the sensor and the at least one sheet layer.

According to various embodiments of the present disclosure, the step compensation member (e.g. the connection member 41 in FIG. 4) includes at least one substrate on which a plurality of first electrodes are formed on one surface for being electrically connected to a sensor (e.g. the sensor s in FIG. 4), and a plurality of second electrodes are formed on the other surface for being electrically connected to the plurality of first electrodes and electrically connected to the flexible substrate.

According to various embodiments of the present disclosure, a fingerprint sensor (e.g. the fingerprint sensor in FIG. 4) includes an active area (AA) (e.g. an active area in FIG. 4) for acquiring a bio-signal for an external object, and an inactive area (NA) in which at least one signal terminal for transmitting the bio-signal is formed (e.g. the inactive area in FIG. 4) wherein the step compensation member is formed in at least a portion of the inactive area and is disposed to overlap with one end of the flexible substrate.

According to various embodiments of the present disclosure, a sheet layer (e.g. the sensor peripheral structure 46 in FIG. 4) includes a blocking member (e.g. the blocking member 461 in FIG. 4) attached to one surface, facing the second direction, of the display panel and an elastic member (e.g. the elastic member 462 in FIG. 4) attached to one surface, facing the second direction, of the blocking member.

According to various embodiments of the present disclosure, at least a portion of the opening of the blocking member (e.g. the blocking member 461 in FIG. 4) is spaced apart by a specified interval from the side of the fingerprint sensor (e.g. the sensor in FIG. 1), and at least a partial area of the opening of the elastic member (e.g. the elastic member 462 in FIG. 4) is spaced apart from the side surface of the fingerprint sensor by a second specified interval greater than the first specified interval.

Various embodiments of the present disclosure disclosed in the present specification and drawings are merely provided with specific examples to easily describe the technical content of the present disclosure and to aid understanding of the present disclosure, and are not intended to limit the scope of the disclosure. Therefore, the scope of the present disclosure should be construed as including all changes or modified forms derived based on the technical idea of the present disclosure in addition to the embodiments disclosed herein.

The invention claimed is:

1. An electronic device, comprising:
   a display panel including a front surface and a rear surface;
   an elastic member, disposed on the rear surface of the display panel, including an opening and having a first designated height;
   a sensor disposed in an inner space formed by a side surface of the opening having the first designated height and the rear surface of the display panel wherein the sensor has a second designated height lower than the first designated height;
   a connection member, electrically connected to the sensor, disposed on the sensor wherein the connection member has a third designated height compensating for a difference between the first designated height and the second designated height; and
   a flexible substrate electrically connected to the connection member through the opening and extending from the opening and disposed under the elastic member.

2. The electronic device of claim 1, wherein the connection member includes a first signal terminal on one side and a second signal terminal on the other side electrically connected to the first signal terminal, and
   wherein the connection member is electrically connected to the sensor using the first signal terminal and electrically connected to the flexible substrate using the second signal terminal.

3. The electronic device of claim 1, wherein the connection member comprises an FPCB (Flexible Printed Circuit Board) or a rigid PCB.

4. The electronic device of claim 1, further comprising an anisotropic conductive member disposed between the connection member and the sensor, and between the connection member and the flexible substrate, wherein the connection member is electrically connected to the sensor and the flexible substrate by the anisotropic conductive member.

5. The electronic device of claim 4, wherein the connection member and the anisotropic conductive member are disposed on the sensor to have a fourth designated height compensating for a difference between the first designated height and the second designated height.

6. The electronic device of claim 1, wherein the sensor comprises a fingerprint sensor, and the fingerprint sensor outputs an ultrasonic wave through at least a portion of the display panel and obtains biometric information by receiving a reflected wave of the ultrasonic wave output from the fingerprint sensor.

7. The electronic device of claim 1, wherein the sensor comprises an active area and a non-active area surrounding the active area, and the connecting member is disposed on at least a portion of the non-active area.

8. The electronic device of claim 1, wherein one end of the flexible substrate is disposed to overlap with the connection member, and the other end of the flexible substrate is disposed to overlap with the elastic member.

9. The electronic device of claim 1, further comprising a blocking member disposed between the elastic member and the rear of the display panel.

10. The electronic device of claim 1, wherein the connection member is disposed in the rear of the display panel in a space between side surfaces of the elastic member.

11. An electronic device, comprising:
a housing including a first plate facing a first direction, a second plate facing a second direction opposite to the first direction, and a side member surrounding at least a portion of a space between the first plate and the second plate;
a display panel including a front surface facing the first direction and a rear surface facing the second direction, and disposed on at least a portion of the first plate in the second direction;
at least one sheet layer disposed on the rear surface of the display panel in the second direction and having an opening in at least a portion;
a fingerprint sensor disposed in contact with the rear surface of the display panel in the opening;
a flexible substrate wherein at least a portion of the flexible substrate overlaps with the fingerprint sensor and at least another portion of the flexible substrate overlaps with the at least one sheet layer; and
a step compensation member disposed between the fingerprint sensor and the flexible substrate, electrically connecting the fingerprint sensor and the flexible substrate, and compensating for a step difference due to a height difference between the sensor and the at least one sheet layer.

12. The electronic device of claim 11, wherein the step compensation member comprises at least one or more substrates in which a plurality of first electrodes electrically connected to the fingerprint sensor are formed on one surface, and a plurality of second electrodes electrically connected to the plurality of first electrodes and electrically connected to the flexible substrate are formed on the other surface.

13. The electronic device of claim 11, wherein the fingerprint sensor comprises an active region for acquiring a bio-signal for an external object and an inactive region in which at least one signal terminal for transmitting the bio-signal is formed, and wherein the step compensation member is disposed in at least a portion of the inactive region and disposed to overlap with one end of the flexible substrate.

14. The electronic device of claim 11, wherein the at least one sheet layer comprises a blocking member attached to one surface, facing the second direction, of the display panel and an elastic member attached to one surface, facing the second direction, of the blocking member.

15. The electronic device of claim 14, wherein at least a partial region of the opening of the blocking member is spaced apart from a side surface of the fingerprint sensor by a first interval, and at least a partial region of the opening of the elastic member is spaced apart from the side surface of the fingerprint sensor by a second interval greater than the first interval.

* * * * *